United States Patent
Pham

(10) Patent No.: US 10,849,249 B1
(45) Date of Patent: Nov. 24, 2020

(54) EXPANDABLE ELECTRONICS STORAGE CHASSIS

(71) Applicant: HEWLETT PACKARD ENTERPRISE DEVELOPMENT LP, Houston, TX (US)

(72) Inventor: Kenny Huy Pham, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/776,786

(22) Filed: Jan. 30, 2020

(51) Int. Cl.
*H05K 7/14* (2006.01)
*H05K 5/03* (2006.01)

(52) U.S. Cl.
CPC ............ *H05K 7/1489* (2013.01); *H05K 5/03* (2013.01); *H05K 7/1435* (2013.01); *H05K 7/1487* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,025,989 A * | 2/2000 | Ayd | .................... | G06F 1/183 312/236 |
| 6,137,684 A * | 10/2000 | Ayd | ..................... | H05K 7/1411 361/608 |
| 7,379,305 B2 * | 5/2008 | Briggs | .................... | G06F 1/181 361/727 |
| 7,455,375 B2 * | 11/2008 | Coffin | ................ | G11B 15/6835 312/333 |
| 7,529,096 B2 * | 5/2009 | Lin | .......................... | G06F 1/18 312/223.2 |
| 8,670,241 B2 * | 3/2014 | Sherrod | ............... | H05K 7/1492 361/725 |
| 9,265,173 B1 * | 2/2016 | Jhang | ..................... | G06F 1/187 |
| 10,289,171 B2 * | 5/2019 | Zhai | ........................ | H05K 1/189 |
| 10,349,554 B2 | 7/2019 | Adrian | | |
| 10,362,706 B2 * | 7/2019 | Sun | ........................ | F16C 11/04 |
| 2013/0265714 A1 * | 10/2013 | Tsao | ...................... | H05K 7/1487 361/679.53 |

FOREIGN PATENT DOCUMENTS

| JP | 4108665 | 6/2008 |
|---|---|---|
| WO | WO-2018110809 | 6/2018 |

\* cited by examiner

*Primary Examiner* — Lisa Lea-Edmonds
(74) *Attorney, Agent, or Firm* — Nolte Intellectual Property Law Group

(57) ABSTRACT

An expandable electronics storage chassis includes a base electronics storage tray and an expansion electronics storage tray. The base electronics storage tray has a first end and a second end. The first end includes a first base edge and a first pair of side edges that define a first opening. The expansion electronics storage tray has a third end and a fourth end. The third end includes a second base edge and a second pair of side edges that define a second opening. The fourth end includes a third base edge and a third pair of side edges that define a third opening. When assembled, the second end of the expansion electronics storage tray overlaps and is coupleable to the first end of the base electronics storage tray.

20 Claims, 11 Drawing Sheets

EXPANDABLE ELECTRONICS STORAGE CHASSIS

BACKGROUND

Computing systems, such as server assemblies, include electronic components. For example, the electronic components may be storage disks. The electronic components may be supported by a storage chassis. The storage chassis with the electronic components may be inserted into a rack to form the computing system.

BRIEF DESCRIPTION OF THE DRAWINGS

The present disclosure is best understood from the following detailed description when read with the accompanying drawings. Features of the present disclosure are illustrated by way of example and not limited in the following figures, in which like numerals indicate like elements, in which.

DETAILED DESCRIPTION

Figure 1:
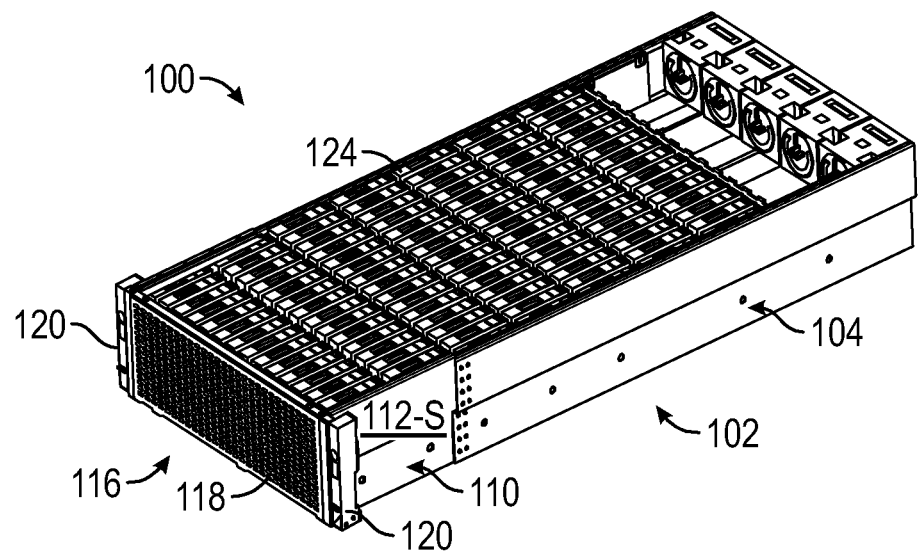
FIG. 1 depicts a device that includes an expandable electronics storage chassis, according to one or more examples of the present disclosure.

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

An electronics storage chassis, also referred to herein as simply a storage chassis, refers to a metal structure that supports electronic components. A storage chassis may be included in a computing system. For example, the storage chassis may be a part of a pluggable module inserted into a rack within the computing system. A computing system may be a storage array, storage device, storage enclosure, server, computer cluster, or any other device or equipment including a controller, a processing resource, or the like.

The electronic components contained within a storage chassis may include storage disks. The storage disks may be connected to other parts of the computing system. Storage disks include a storage medium such as a hard disk drive ("HDD"), a solid-state drive ("SSD"), or any other type of storage medium that may be contained within a storage chassis. A storage medium may be any electronic, magnetic, optical, or other physical storage apparatus to contain or store information such as executable instructions, data, and the like. For example, any storage medium described herein may be any of Random Access Memory ("RAM"), volatile memory, non-volatile memory, flash memory, a storage drive (e.g., a hard drive), a solid state drive, any type of storage disc (e.g., a compact disc, a DVD, etc.), and the like, or a combination thereof. Any storage medium described herein may be non-transitory.

A length of some storage chassis may be fixed. For example, the storage chassis may have an industry standard length of 1075 millimeters. As such, the storage chassis can only support a limited number of electronic components. Accordingly, to accommodate additional of the same type of electronic components, for instance, an additional storage chassis is tooled. Tooling costs may include the cost of the storage chassis material. Tooling costs may further include the cost of labor to mechanically and electrically connect the additional storage chassis and electronic components therein to the computing system. These tooling costs remain substantially constant whether the additional storage chassis holds the maximum number or a lesser number of the electronic components.

According to illustrative examples, an expandable electronics storage chassis includes a base chassis portion and an extension chassis portion. The extension chassis portion, which may have different lengths, may be attached to the base chassis portion. Adding the extension chassis portion to the base chassis portion extends the overall length of the storage chassis to, thereby, support an additional number of electronic components. Thus, providing the extension chassis portion allows a common base chassis portion to be used to support different numbers of electronic components without the costs associated with tooling a separate storage chassis. This may provide for efficiency and flexibility in manufacturing and may also reduce costs.

Figure 2:
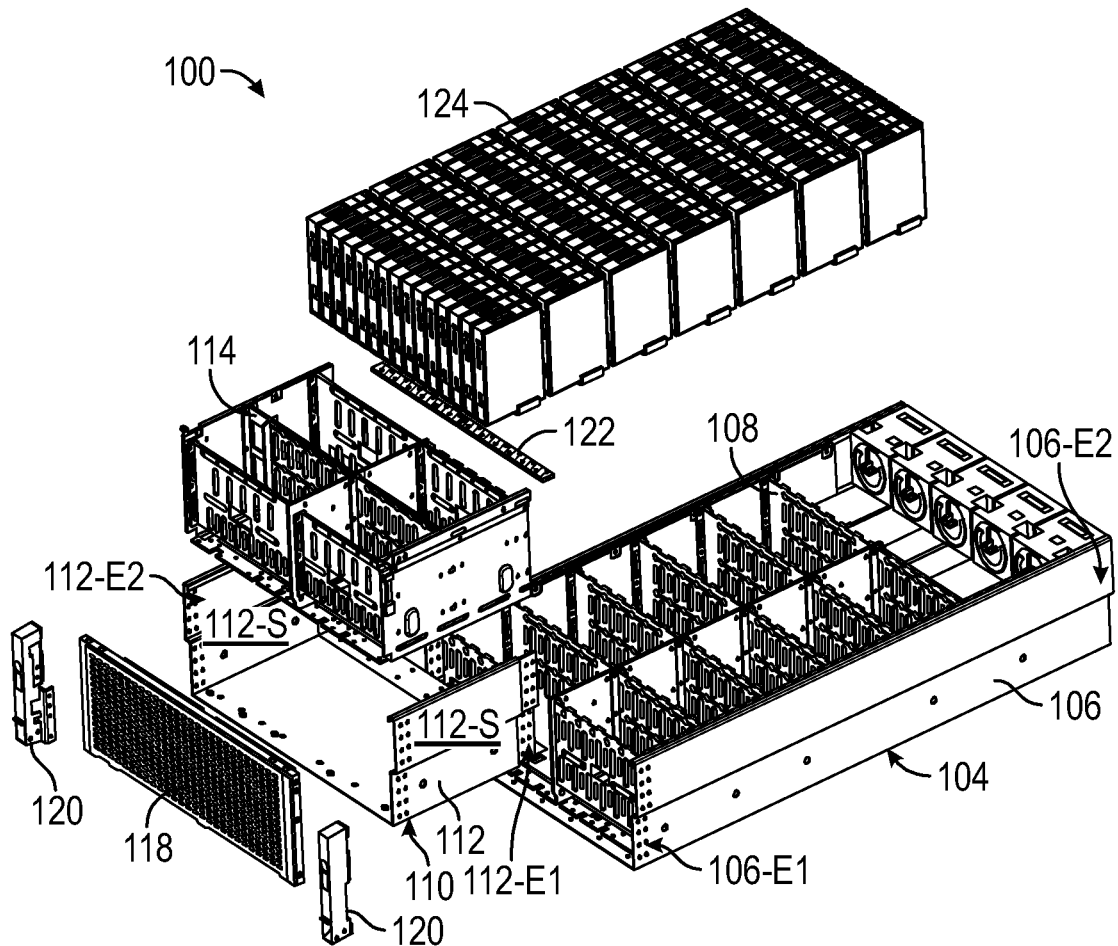
FIG. 2 depicts the device shown in FIG. 1 in a partially exploded view and with a portion of the device exploded, according to one or more examples of the present disclosure.

Turning now to the drawings, FIGS. 1 and 2 depict a device 100 that includes an expandable electronics storage chassis 102, according to one or more examples of the present disclosure. FIG. 1 depicts the assembled device 100, and FIG. 2 depicts the device 100 with a portion thereof partially exploded. In an example, the device 100 may be a part of a computing system, such as a server assembly, that is not otherwise shown. As such, the device 100 may include additional electronic components of the computing system. As illustrated, these additional electronic components of the device 100 include a plurality of storage disks 124 within and supported by the expandable electronics storage chassis 102.

The expandable electronics storage chassis 102 includes a base chassis portion 104, an expansion chassis portion 110, and an opening cover 116. The base chassis portion 104 includes a base electronics storage tray 106 and a first electronics storage bucket 108. The expansion chassis portion 110 includes an expansion electronics storage tray 112 and a second electronics storage bucket 114, both as shown in FIG. 2.

When the device 100 is assembled, as illustrated in FIG. 1, the expansion chassis portion 110 is attached to the base chassis portion 104. For example, the base electronics storage tray 106 defines a first opening at a first end 106-E1 of the base electronics storage tray 106. The expansion electronics storage tray 112 defines a second opening at a second end 112-E1 and a third opening at a third end 112-E2 of the expansion electronics storage tray 112. When assembled, the second end 112-E1 of the expansion electronics storage tray 112 overlaps and is coupleable to the first end 106-E1 of the base electronics storage tray 106.

In one implementation, as shown in FIG. 2, the expandable electronics storage chassis 102, further includes a support bracket 122 coupleable to the overlapping first end 106-E1 of the base electronics storage tray 106 and second end 112-E1 of the expansion electronics storage tray 112. (The support bracket 122 is not visible in FIG. 1 as it is located on the underside of the storage disks 124.) In a further implementation, the support bracket 122 may be coupleable to the first electronics storage bucket 108 and the second electronics storage bucket 114. The support bracket 122 may provide added support at points of attachment between the base chassis portion 104 and the expansion chassis portion 110.

The coupling and attachment between the base chassis portion 104 and expansion chassis portion 110 may be implemented using any suitable type of fastener and/or attachment mechanism. For example, the fastener and/or attachment mechanism may include, but is not limited to, screws, bolts, spools with corresponding apertures, etc. Accordingly, the fastener and/or attachment mechanism may create non-permanents joints to allow easy disassembly of the device 100.

The opening cover 116 includes a cover plate 118 and a pair of mounting brackets 120. When the device 100 is assembled, the cover plate 118 and the pair of mounting brackets 120 are attached to the expansion chassis portion 110. For example, as illustrated in FIG. 1, the cover plate 118 is mounted over the third opening at the third end 112-E2, shown best in FIG. 2, of the expansion electronics storage tray 112. Further, the pair of mounting brackets 120 is attached to the third end 112-E2, shown in FIG. 2, on a pair of sides 112-S of the expansion electronics storage tray 112. The coupling and attachment between the opening cover 116 and the expansion chassis portion 110 may be implemented using any suitable type of fastener and/or attachment mechanism. For example, the fastener and/or attachment mechanism creates non-permanent joints and may include, but is not limited to, screws, bolts, etc. The non-permanent joints may allow easy removal of the opening cover 116 from the device 100.

Figure 3:
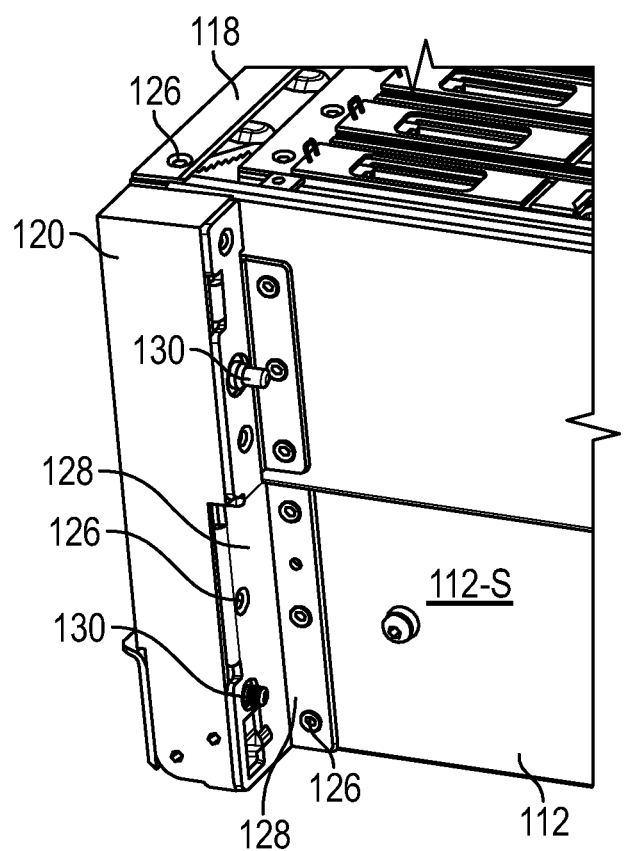
FIG. 3 depicts an enlarged partial view of an opening cover coupled to an expansion electronics storage tray of the device shown in FIGS. 1 and 2, according to one or more examples of the present disclosure.

FIG. 3 depicts an enlarged, fragmented view of the opening cover 116 coupled to the expansion electronics storage tray 112 of the device 100 shown in FIGS. 1 and 2, according to one or more examples of the present disclosure. Particularly, the mounting bracket 120 is attached to the side 112-S of the expansion electronics storage tray 112. The cover plate 118 is also attached to the expansion electronics storage tray 112.

In this example, the attachment mechanism includes multiple screws 126 and one or more brackets 128. As such, the mounting bracket 120 is attached to the side 112-S of the expansion electronics storage tray 112 using the screws 126 and the brackets 128. Namely, the screws 126 are inserted into and screwed through corresponding holes (not shown) in the side 112-S of the expansion electronics storage tray 112, in the brackets 128, and in the mounting bracket 120.

Additionally, multiple screws may be used to attach the cover plate 118 to the expansion electronics storage tray 112. For example, a bottom of the cover plate 118, and/or sides of the cover plate 118 may be attached to the expansion electronics storage tray 112. Moreover, a top of the cover plate 118 (a portion of which is shown) may be attached to a lip extending from the electronics storage bucket 114 (not shown in FIG. 3) using screws 126.

In the example illustrated, each mounting bracket 120 includes pins 130 extruding therefrom. The pins 130 may be used to mount the device 100 to a rack of a computing system.

Turning again to the device 100 as illustrated in FIGS. 1 and 2, the base chassis portion 104 holds and supports a first plurality of the storage disks 124. The expansion chassis portion 110 holds and supports a second plurality of the storage disks 124.

For example, the first electronics storage bucket 108 includes one or more bays or compartments to receive a first plurality the of storage disks 124. The second electronics storage bucket 114 includes one or more bays to receive a second plurality of the storage disks 124. More particularly, the first electronics storage bucket 108 includes ten (10) bays to receive and store 75 of the storage disks 124. The second electronics storage bucket 114 includes four (4) bays to receive and store 30 of the storage disks 124. However, either or both of the first electronics storage bucket 108 and the second electronics storage bucket 114 may have more or fewer bays.

In an alternative example (not shown), the base electronics storage tray 106 may contain one or more bays to receive a first plurality of electronic components, such as the storage disks 124. Likewise, the expansion electronics storage tray 112 may contain one or more bays to receive a second plurality of electronic components, such as the storage disks 124.

As illustrated, a length of the base electronics storage tray 106 from the end 106-E1 to an end 106-E2 is greater than a length of the expansion electronics storage tray 112 from the end 112-E1 to the end 112-E2. The lengths of the base electronics storage tray 106 and the expansion electronics storage tray 112 may vary depending on implementation specifics. However, in general, by including a base chassis portion, a length of a device (such as the device 100) may be extended to accommodate additional electronic components (not labeled). The additional electronic components may be accommodated without additional tootling costs.

In one example, the base electronics storage tray 106 may have an industry standard length of 1075 millimeters. Accordingly, a length of the device 100 may be expanded from the standard length to an expanded length depending on the length of the expansion electronics storage tray 112. In a particular example, the length of the device 100 expands from 1075 millimeters when the expansion electronics storage tray 112 is detached to 1200 millimeters when the expansion electronics storage tray 112 is attached.

In a further example, the device 100 has a height that conforms to an industry standard. For instance, a height of the device 100 may be measured as a multiple of rack units, thereby "conforming to" a standard rack unit height. A standard "rack unit" is defined as 1¾ inches or 44.45 millimeters. In a particular example, a height of the base chassis portion 104 and a height of the expansion chassis portion 110 both conform to a standard four rack unit ("4U") height. As such, a height of the base electronics storage tray 106 and a height of the expansion electronics storage tray 112 both conform to a standard 4U height. A width of the device 100 may be a standard width, such as 19 inches. Having one or more standard measurements, allows the device 100 to be adapted to equipment, such as racks, that have one or more standard measurements. However, in different examples, the device 100 may have one or more non-standard measurements.

Figure 4:
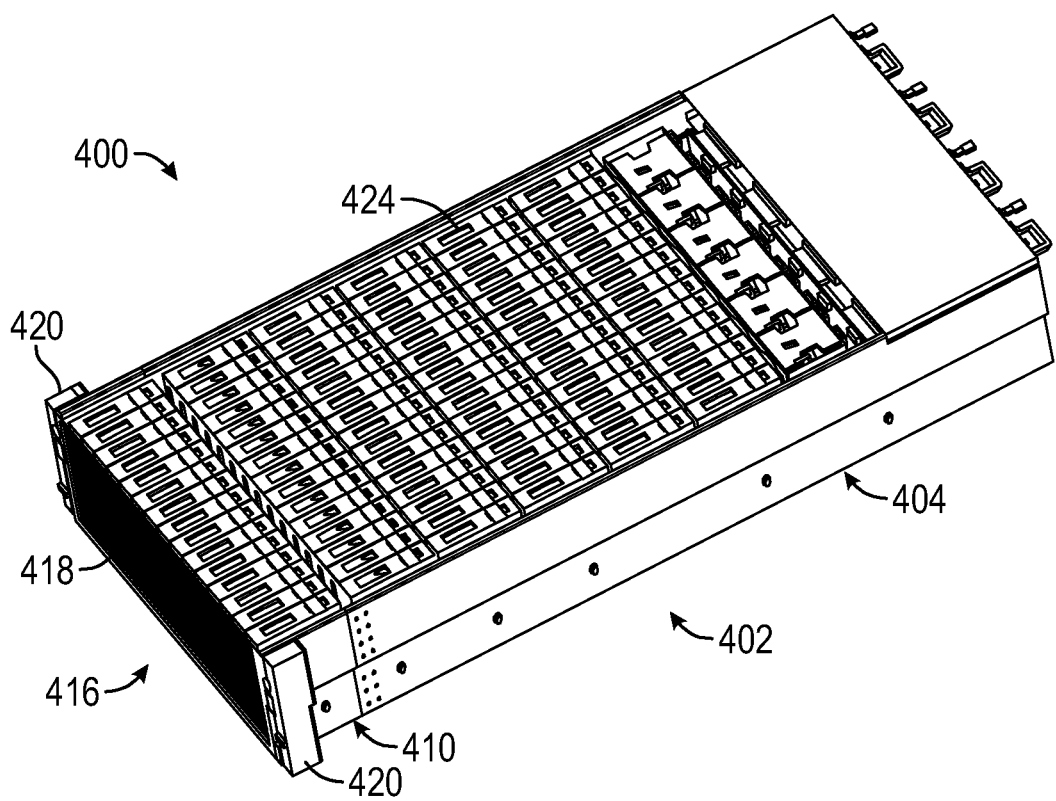
FIG. 4 depicts another device that includes an expandable electronics storage chassis in an assembled, perspective view, according to one or more examples of the present disclosure.
Figure 5:
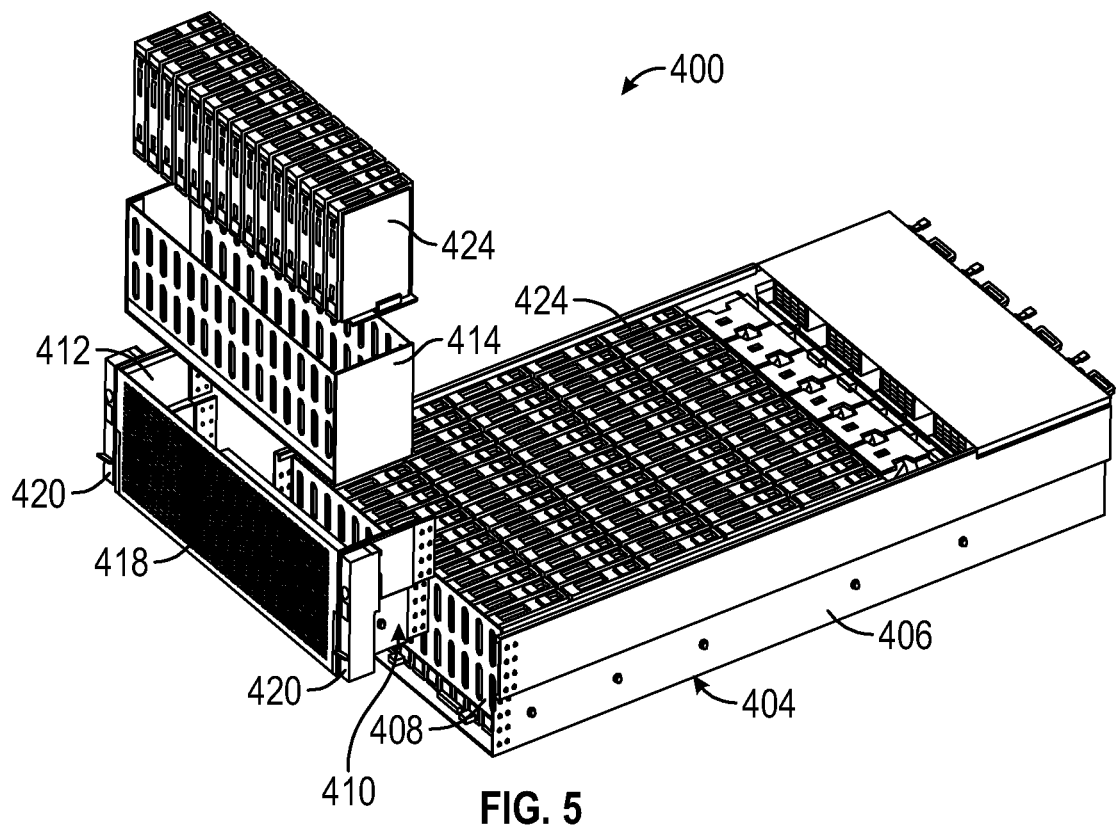
FIG. 5 depicts the device shown in FIG. 4 in a partially exploded view and with a portion of the device exploded, according to one or more examples of the present disclosure.

FIGS. 4 and 5 depict a device 400 that includes an expandable electronics storage chassis 402 that supports a plurality of storage disks 424, according to one or more examples of the present disclosure. FIG. 4 depicts the assembled device 400, and FIG. 5 depicts the device 400 with a portion thereof exploded.

The expandable electronics storage chassis 402 includes a base chassis portion 404, an expansion chassis portion 410, and an opening cover 416. The base chassis portion 404 includes a base electronics storage tray 406 and a first electronics storage bucket 408. The expansion chassis portion 410 includes an expansion electronics storage tray 412 and a second electronics storage bucket 414.

When the device 400 is assembled, as illustrated in FIG. 4, the expansion chassis portion 410 is attached to the base chassis portion 404, for example as described above by reference to device 100. In one example, the expansion chassis portion 410 is attached to the base chassis portion 404 without using a support bracket, e.g., similar to the support bracket 122 (in FIG. 2). In another example, the expansion chassis portion 410 is attached to the base chassis portion 404 using a support bracket (not shown).

The opening cover 416 includes a cover plate 418 and a pair of mounting brackets 420. When the device 400 is assembled, the cover plate 418 and the pair of mounting brackets 420 are attached to the expansion chassis portion 410. For example, the cover plate 418 is mounted over an opening at an end of the expansion electronics storage tray 412. Further, the pair of mounting brackets 420 is attached to the same end on a pair of sides of the expansion electronics storage tray 412. In an example, the opening cover 416 may be coupled to the expansion electronics storage tray 412 as described above by reference to FIG. 3.

As illustrated, the base chassis portion 404 holds and supports a first plurality of the storage disks 424. The expansion chassis portion 410 holds and supports a second plurality of the storage disks 424. For example, the first electronics storage bucket 408 may include a plurality of bays to receive 75 of storage disks 424. As illustrated, the second electronics storage bucket 414 includes a single bay to receive 15 of the storage disks 424. Accordingly, the device 400 may accommodate fewer storage disks than the device 100, without wasted space in the expansion electronics storage chassis 402.

Figure 6:
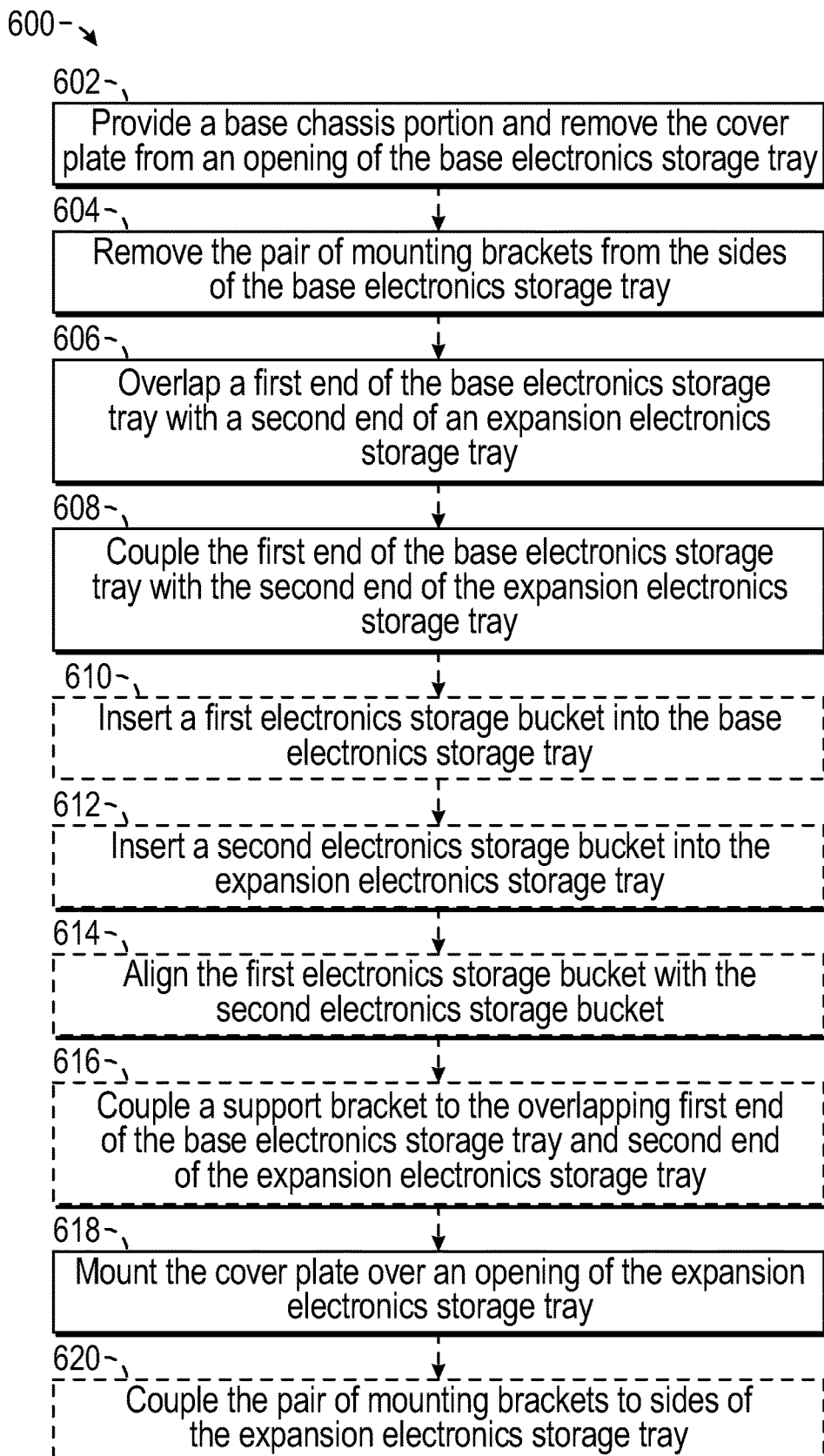
FIG. 6 depicts a flow diagram illustrating a method for assembling a device having an expandable electronics storage chassis, according to one or more examples of the present disclosure.

FIG. 6 depicts a flow diagram illustrating a method 600 for assembling a device, such as a device 700, having an expandable electronics storage chassis, according to one or more examples of the present disclosure. The device 700 is collectively identified by 6 stages of assembly 700-1, 700-2, 700-3, 700-4, 700-5, and 700-6 as illustrated in the remaining FIGS. 7-14. Accordingly, the method 600 for assembling the device 700 will be described concurrently with FIGS. 7-14 illustrating the device 700 being assembled. In one example, the method 600 is performed in whole through an automated assembly process. However, in other examples, one or more of the method 600 blocks may be manually performed in whole or in part.

Turning now to the method 600, at a block 602, a base chassis portion of the device 700 is provided, and a cover plate is removed from an opening of a base electronic storage tray of the device 700. At a block 604, a pair of mounting brackets is removed (604) from sides of the base electronics storage tray.

Figure 7:
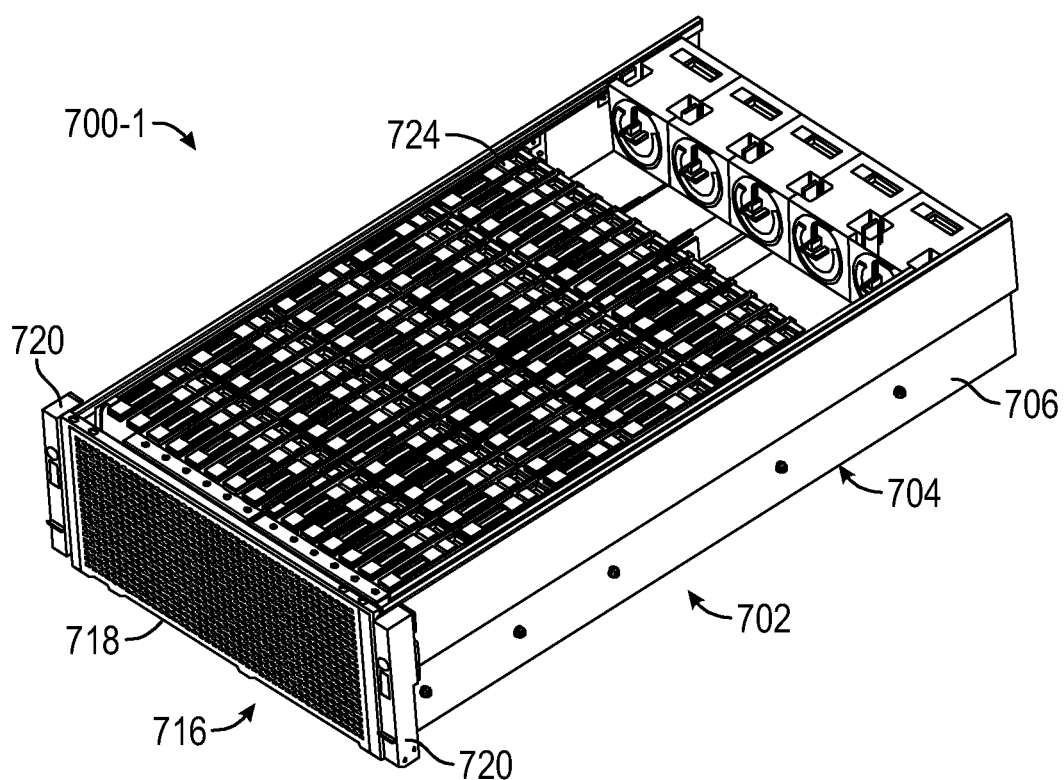
FIG. 7 depicts a device at a first stage of assembly having a base chassis portion without an expansion chassis portion, according to one or more examples of the present disclosure.
Figure 8:
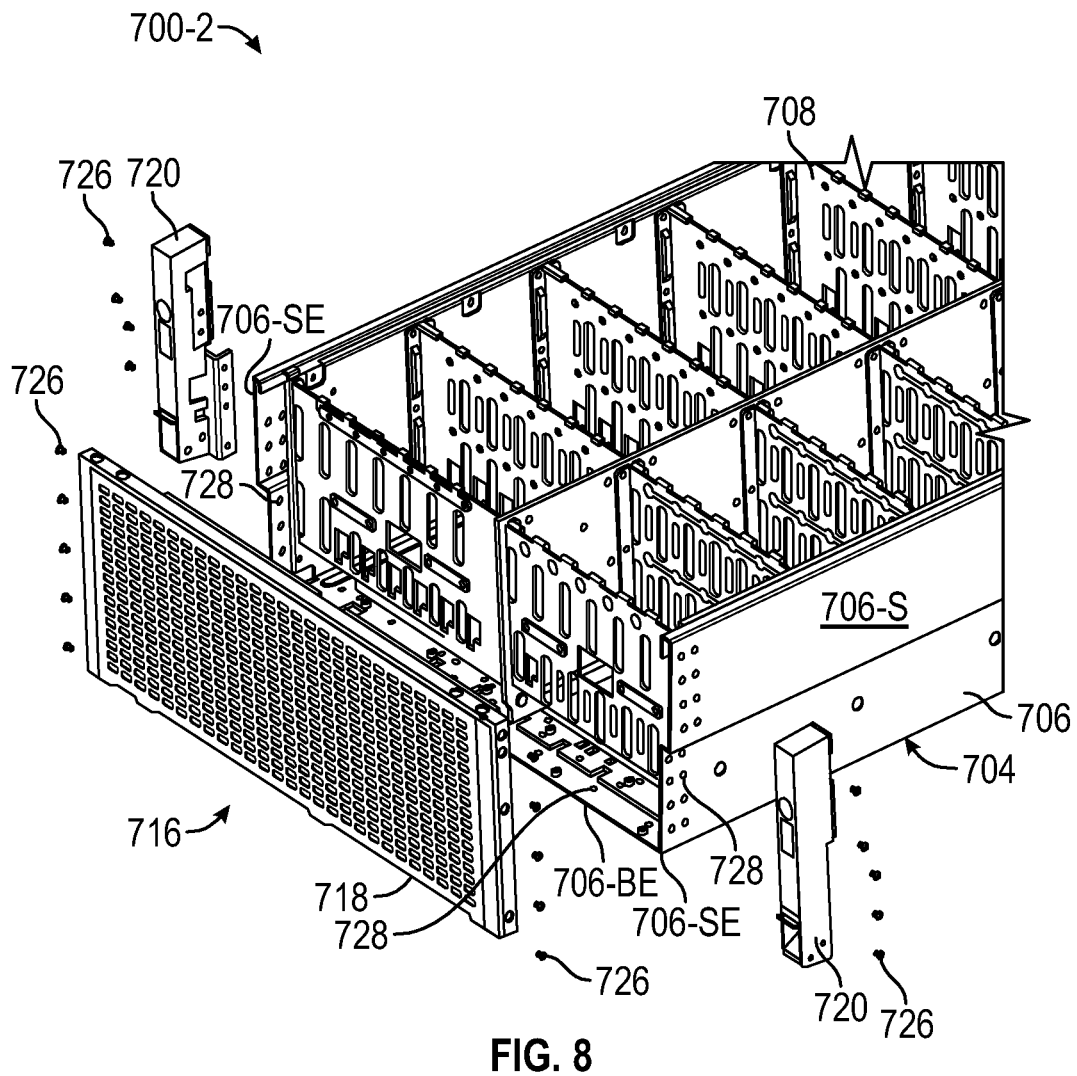
FIG. 8 depicts the device of FIG. 7 at a second stage of assembly, wherein a cover plate and a pair of mounting brackets have been removed from the base chassis portion, according to one or more examples of the present disclosure.

Blocks 602 and 604 will be described by reference to FIGS. 7 and 8. FIG. 7 depicts the device 700 at the first stage of assembly 700-1, within which is provided (602) a base chassis portion 704 without an expansion chassis portion, according to one or more examples of the present disclosure. FIG. 8 depicts the device 700 at the second stage of assembly 700-2, wherein a cover plate 718 and a pair of mounting brackets 720 are removed (602, 604) from the base chassis portion 704, according to one or more examples of the present disclosure.

As illustrated in FIG. 7, the device 700 includes an expandable electronics storage chassis 702, which includes the base chassis portion 704 and also includes an opening cover 716 coupled to the base chassis portion 704. The base chassis portion 704 includes a base electronics storage tray 706 and may include an electronics storage bucket 708 (in FIG. 8) within the base electronics storage tray 706. The base chassis portion 704 may store and support a plurality of electronics components (in this case storage disks 724). For example, the storage disks 724 may be stored and supported within a plurality of bays of the electronics storage bucket 708.

In an example, the storage disks 724 may be removed from the electronic storage bucket 708 before or after performing the blocks 602 and 604 of the method 600. This may facility easier implementation of the remaining blocks 606-620 of the method 600, due to the removal of the weight of the storage disks 724. In another example, the device 700 may not house the storage disks 724 when the blocks 602 and 604 of the method 600 are performed. FIG. 8 illustrates the example of performing the blocks 602 and 604 without the storage disks 724 housed in the base chassis portion 704. In yet another example, the method 600 may start with providing the device 700 having the base chassis portion 704 without the opening cover 716 and the storage disks 724. In this example, the remainder of block 602 and block 604, which includes removing the opening cover 716, may be eliminated from the method 600. In yet another example, the base electronics storage tray 706 may be provided without the electronics storage bucket 708.

The opening cover 716 includes the cover plate 718 and the pair of mounting brackets 720. The cover plate 718 is mounted over an opening at an end of the base electronics storage tray 706. Further, the pair of mounting brackets 720 is attached to the same end on a pair of sides 706-S (in FIG. 8) of the base electronics storage tray 706.

Turning back to the description of FIGS. 7 and 8, at the assembly stage 700-1, the cover plate 718 is mountable over the opening at the end of the base electronics storage tray 706, when an expansion electronics storage tray is detached from the base electronics storage tray 706. However, as will be later described, the same cover plate 718 is mountable over an opening at an end of the expansion electronics storage tray when the expansion electronics storage tray is attached to the base electronics storage tray 706.

Likewise, at the assembly stage 700-1, the pair of mounting brackets 720 is coupleable to the end of the base electronics storage tray 706, when an expansion electronics storage tray is detached from the base electronics storage tray 706. More particularly, the pair of mounting brackets 720 may be coupleable near a pair of side edges of the base electronics storage tray 706. However, as will be later described, the same pair of mounting brackets 720 is coupleable to the end of the expansion electronics storage tray when the expansion electronics storage tray is attached to the base electronics storage tray 706. More particularly, the pair of mounting brackets 720 may be coupleable near a pair of side edges of the expansion electronics storage tray.

As partially illustrated in FIG. 8, the base electronics storage tray 706 has a pair of sides 706-S that extends perpendicularly from a base (not shown). A pair of side edges 706-SE and a base edge 706-BE define an opening at an end of the base electronics storage tray 706. An "end" is defined as an area of an electronics storage tray that includes a base edge and side edges. The "end" is further defined by an area of the base and sides that is adjacent to the base and side edges and includes coupling mechanisms (such as holes, spools, etc.) for attaching an opening cover or another electronics storage tray. In the present example, an end of the base electronics storage tray 706 is defined as the area that includes the base edge 706-BE and the side edges 706-SE and an adjacent area having coupling mechanisms 728. The coupling mechanisms 728 include holes. Thus, hereinafter, the term holes 728 may be used interchangeably with the term coupling mechanisms 728. The coupling mechanisms 728 may include other features, such as spools, that extend from the base and allow an expansion electronics storage tray to be attached to the base electronics storage tray 706.

At the assembly stage 700-2, the mounting brackets 720 are removed (604) from the sides 706-S of the base electronics storage tray 706. This includes removing screws 726 (from holes 728) that couple the mounting brackets 720 near the side edges 706-SE of the base electronics storage tray 706. An element being "coupled near" an edge of an electronics storage tray means that at least a portion of the element is coupled within the area defined as the end of the electronics storage tray. As such, being coupled near the edge may include the element physically contacting the edge.

At the assembly stage 700-2, the cover plate 718 is also removed (602) from the sides 706-S of the base electronics storage tray 706. This includes removing screws 726 (from holes 728) that couple the cover plate 718 near the side edges 706-SE of the base electronics storage tray 706. Although not shown, removing (602) the cover plate 718 may also include removing screws from holes that couple the cover plate 718 near the base edge 706-BE of the base electronics storage tray 706 and removing screws from holes that couple the cover plate 718 to a lip extending from the electronics storage bucket 708.

Figure 9:
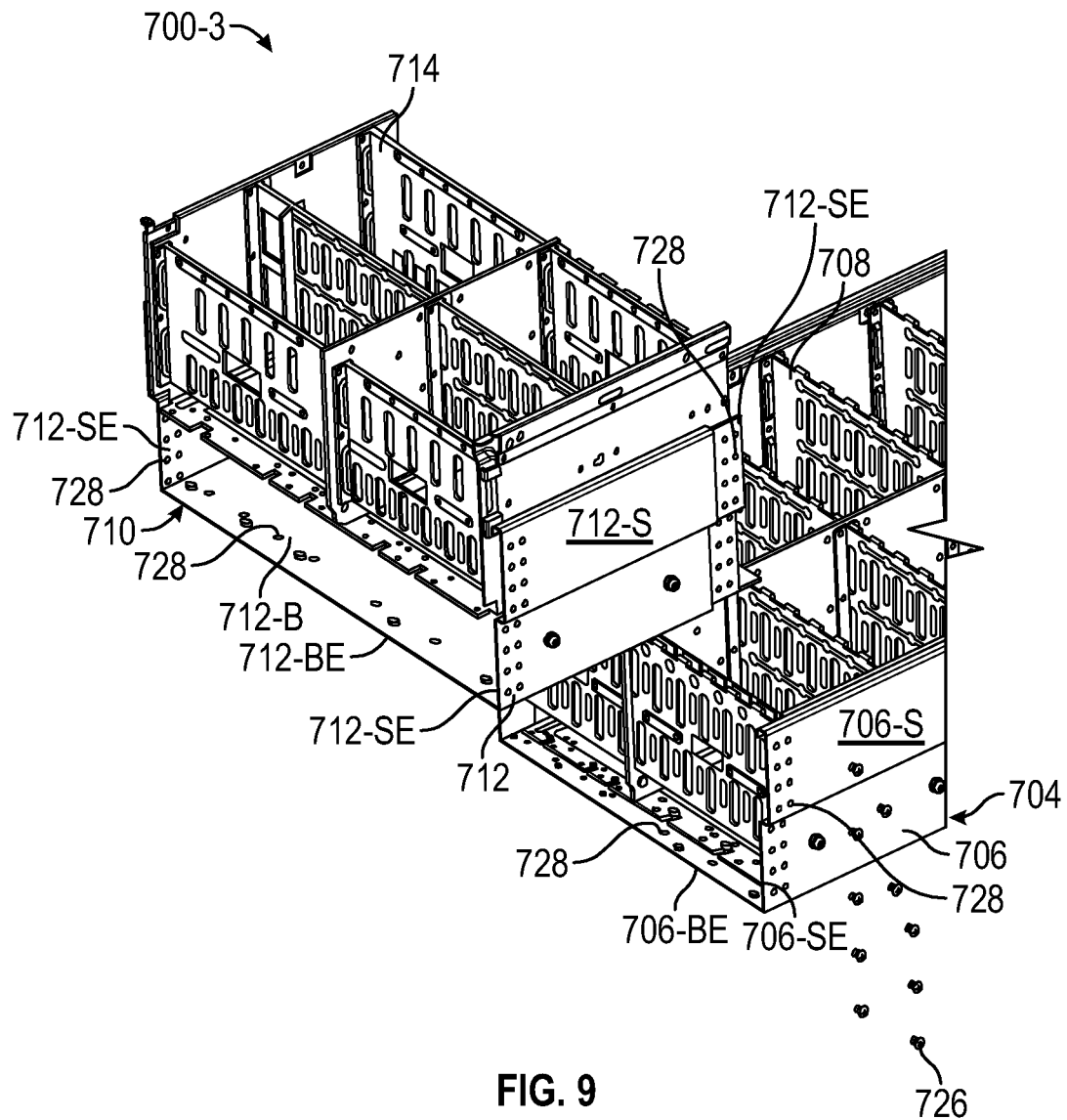
FIG. 9 depicts the device of FIG. 7 and FIG. 8 at a third stage of assembly, wherein an expansion chassis portion that includes an expansion electronics storage tray is being inserted into the base chassis portion that includes a base electronics storage tray, according to one or more examples of the present disclosure.

Returning to the method 600, at a block 606, an end of the base electronics storage tray 706 is overlapped with an end of an expansion electronics storage tray 712 of FIG. 9. FIG. 9 will be used to further describe block 606. FIG. 9 depicts the device 700 at the third stage of assembly 700-3, wherein an expansion chassis portion 710 that includes the expansion electronics storage tray 712 is being inserted into the base chassis portion 704, according to one or more examples of the present disclosure.

As illustrated in FIG. 9, the expansion chassis portion 710 includes the expansion electronics storage tray 712 and an electronics storage bucket 714 contained therein. The expansion electronics storage tray 712 has a pair of sides 712-S that extends perpendicularly from a base 712-B. A pair of side edges 712-SE and a base edge 712-BE define an opening at one end of the expansion electronics storage tray 712, furthest from the base chassis portion 704. Similarly, a pair of side edges 712-SE (one shown) and a base edge 712-BE (not shown) define an opening at the other end of the expansion electronics storage tray 712, closest to the base chassis portion 704.

At the assembly stage 700-3, overlapping (606) an end of the expansion electronics storage tray 712 with an end of the base electronics storage tray 706 includes overlapping holes (not shown) near the base edge (not shown) of the expansion electronics storage tray 712 with holes 728 near the base edge 706-BE of the base electronics storage tray 706. Additionally, overlapping (606) an end of the expansion electronics storage tray 712 with an end of the base electronics storage tray 706 includes overlapping holes 728 near the side edges 712-SE of the expansion electronics storage tray 712 with holes 728 near the side edges 706-SE of the base electronics storage tray 706.

Figure 10:
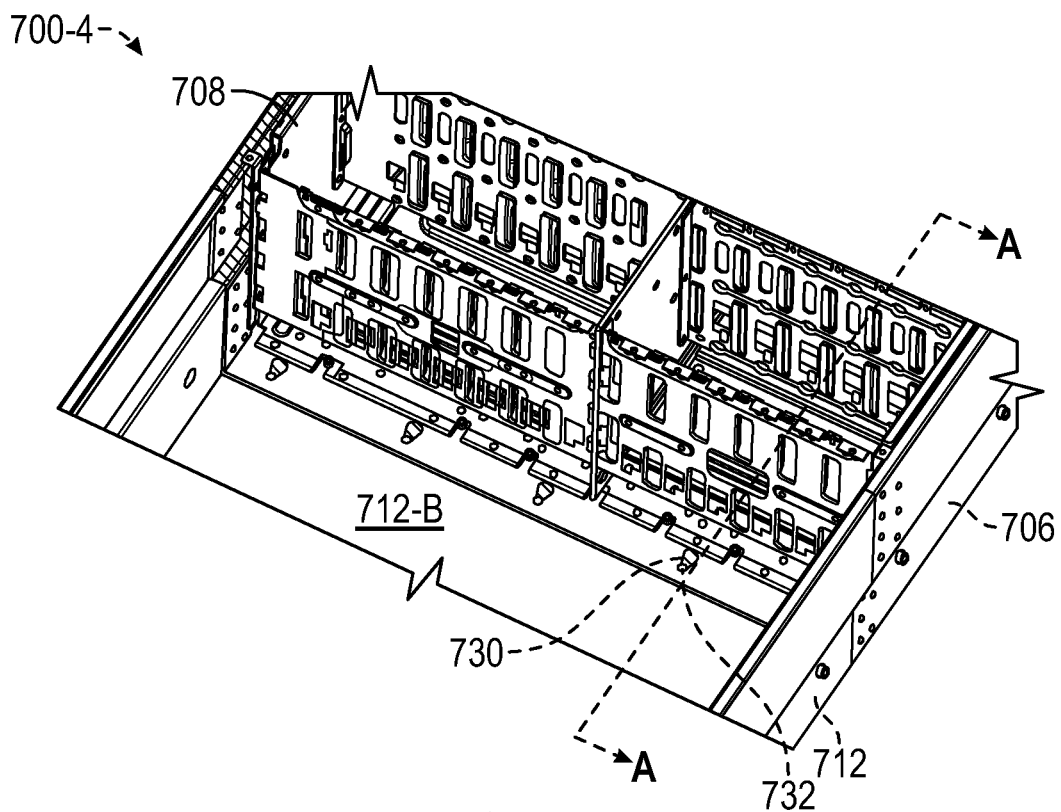
FIG. 10 depicts the device of FIG. 7-FIG. 9 at a fourth stage of assembly, wherein the expansion electronics storage tray is coupled to the base electronics storage tray, according to one or more examples of the present disclosure.
Figure 11:
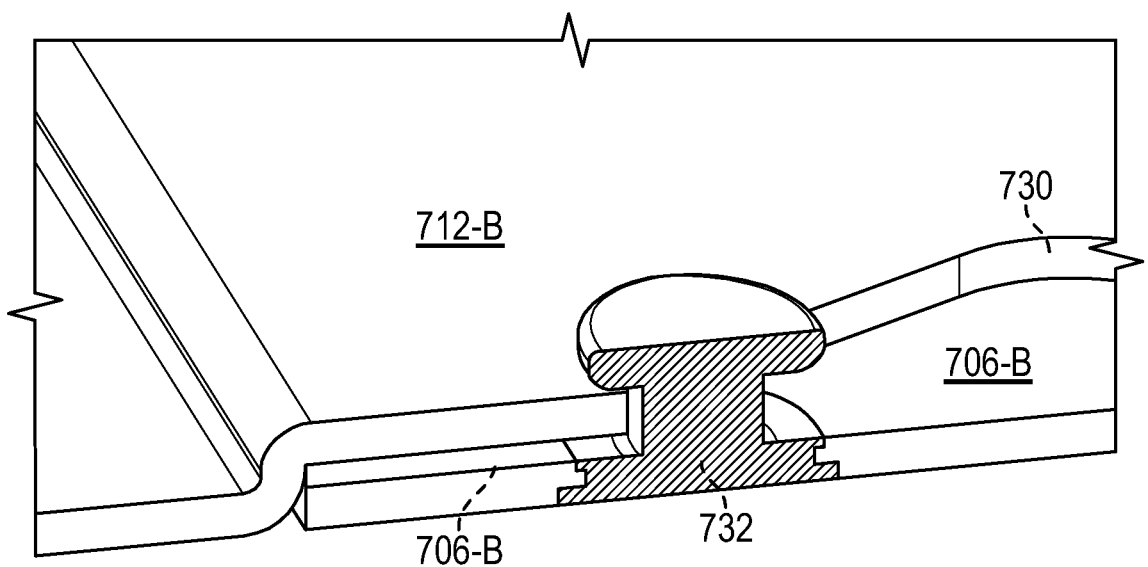
FIG. 11 depicts an enlarged cross-sectional view of a spool and corresponding aperture, first shown in FIG. 10, which is used to couple the expansion electronics storage tray to the base electronics storage tray, according to one or more examples of the present disclosure.

Returning to the method 600, at a block 608, the base electronics storage tray 706 is coupled to the expansion electronics storage tray 712. FIGS. 9-11 will be used to further explain block 608.

In an example illustrated by reference to FIG. 9 and the previous description, screws 726 may be inserted through the overlapping holes 728 to secure (608) the expansion electronics storage tray 712 to the base electronics storage tray 706. Moreover, FIG. 10 depicts the device 700 at the fourth stage of assembly 700-4, wherein the expansion electronics storage tray 712 is coupled to the base electronics storage tray 706, according to one or more examples of the present disclosure.

Namely, spools 732 extending from the base 706-B of the base electronics storage tray 706 are inserted through corresponding apertures 730 in the base 712-B of the expansion electronics storage tray 712. FIG. 11 depicts an enlarged cross-sectional view through a line AA of a spool 732 and corresponding aperture 730, shown in FIG. 10, which is used to couple (608) the expansion electronics storage tray 712 to the base electronics storage tray 706, according to one or more examples of the present disclosure. In addition, the spool 732 and corresponding aperture 730 coupling mechanism may be used to align the base electronics storage tray 706 with the expansion electronics storage tray 712 for further assembly of the device 700.

Figure 12:
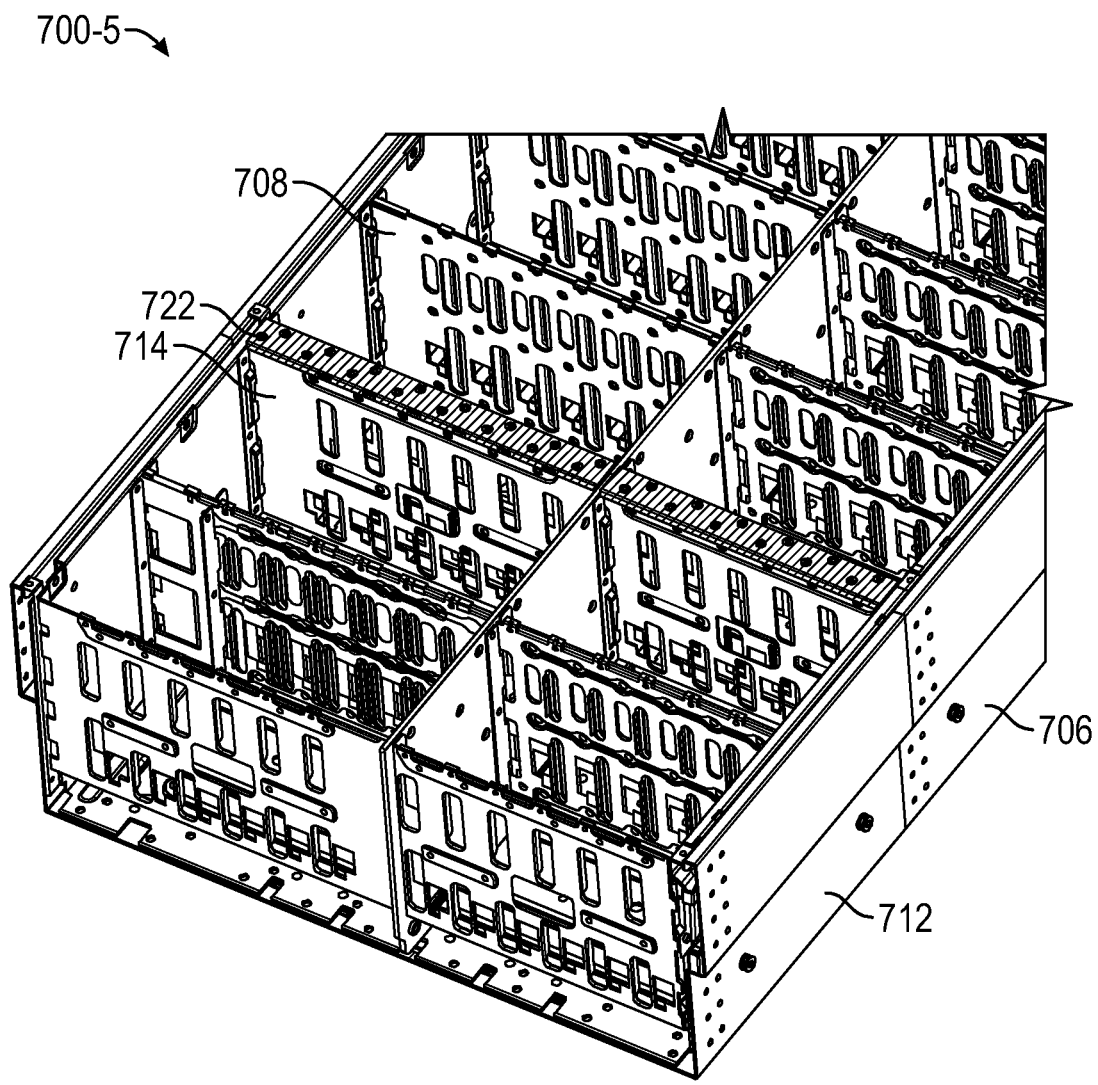
FIG. 12 depicts the device of FIG. 7-FIG. 10 at a fifth stage of assembly, wherein an overlapping first end of the base electronics storage tray and second end of the expansion electronics storage tray are coupled using a support bracket, according to one or more examples of the present disclosure.
Figure 13:
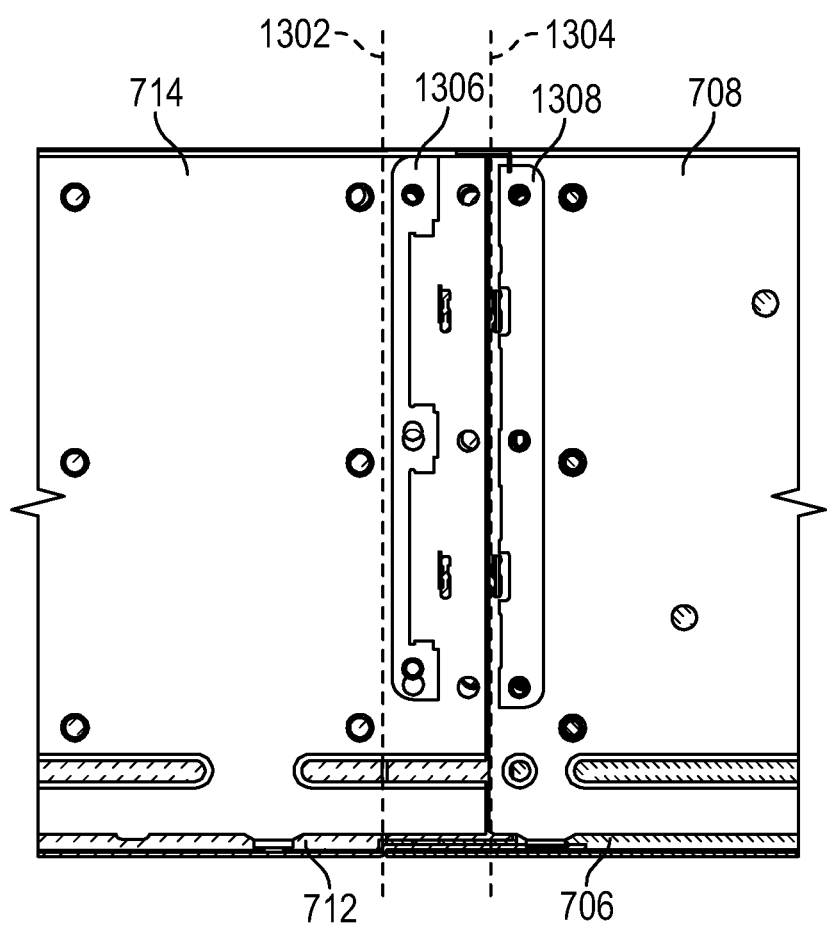
FIG. 13 depicts aligning a first electronics storage bucket with a second electronics storage bucket, according to one or more examples of the present disclosure.

Returning to the method 600, blocks 610-616 are described by reference to FIGS. 12 and 13. FIG. 12 depicts the device at the fifth stage of assembly 700-5, according to one or more examples of the present disclosure. It the fifth stage of assembly 700-5, the electronics storage bucket 714 may be inserted (612) into the expansion electronics storage tray 712. Also, if the electronics storage bucket 708 has not been provided, it may be inserted (610) into the base electronics storage tray 706.

At block 614, the electronics storage bucket 708 and the electronics storage bucket 714 are aligned. FIG. 13 depicts an example of aligning (614) the electronics storage bucket 708 and the electronics storage bucket 714. FIG. 13 illustrates a first alignment line 1302 and a second alignment line 1304. The first alignment line 1302 corresponds to and directly aligns with the base edge 706-BE (not shown in FIG. 13) of the base electronics storage tray 706. The second alignment line 1304 lies between a base edge of the electronics storage bucket 708 and a base edge of the electronics storage bucket 714. In a particular example, the base edge of the electronics storage bucket 708 contacts the base edge of the electronics storage bucket 714 at the alignment line 1304. As illustrated, the first alignment line 1302 is offset from the second alignment line 1304. This offset may provide further structural support when electronic components are inserted into the device 700.

At block 616, a support bracket 722 is coupled where the end of the base electronics storage tray 706 and the end of the expansion electronics storage tray 712 overlap. For example, holes in a bracket 1306 coupled to the electronics storage bucket 714 align with holes 728 near the base edge 712-BE of the expansion electronics storage tray 712. Similarly, holes in a bracket 1308 coupled to the electronics storage bucket 708 align with holes 728 near the base edge 706-BE of the base electronics storage tray 706. Additionally, holes in the support bracket 722 may be aligned with the holes in the brackets 1306 and 1308 and screws secured through the aligned holes.

Figure 14:
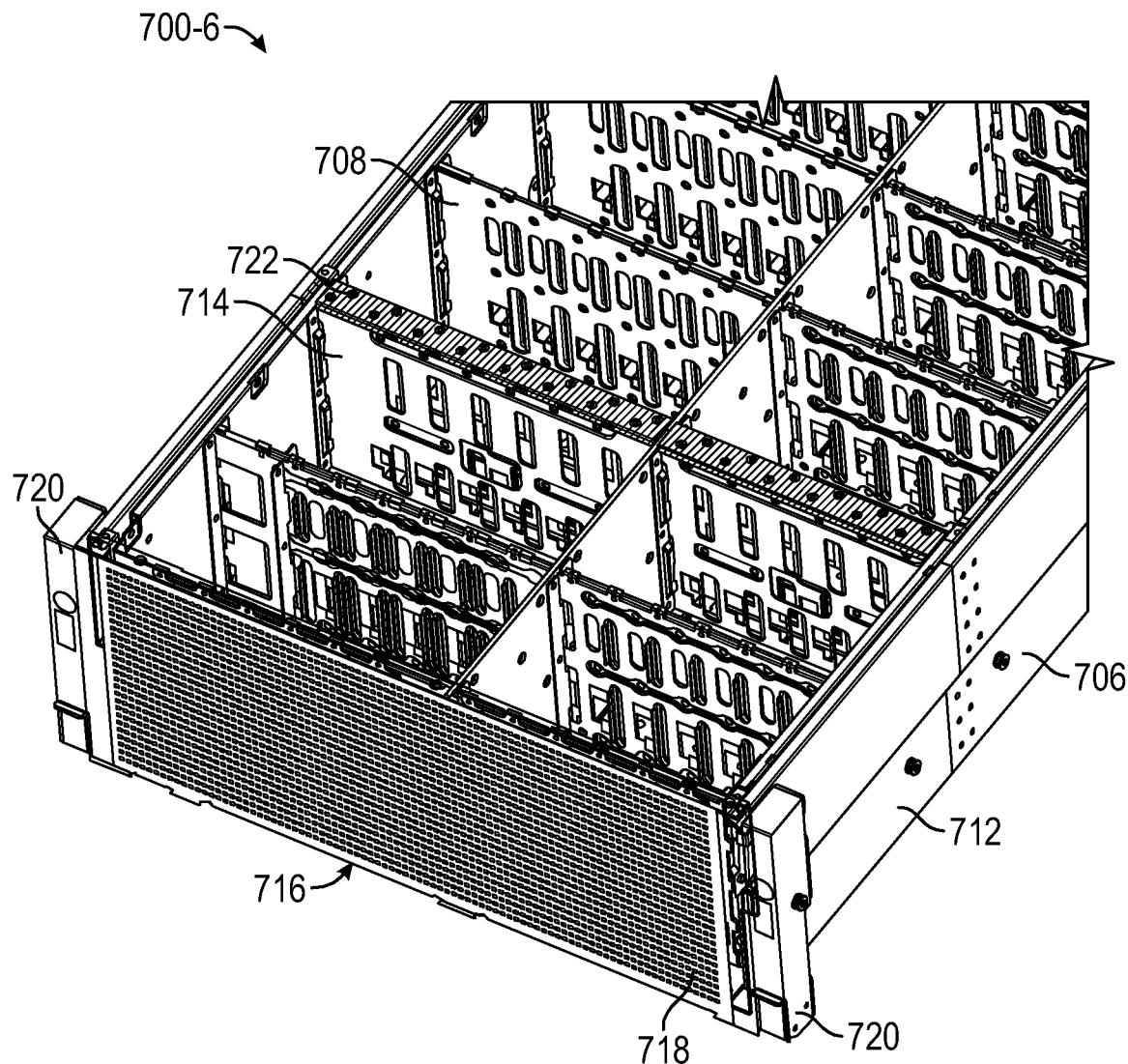
FIG. 14 depicts the device at a sixth stage of assembly, wherein the cover plate and the pair of mounting brackets are coupled to the expansion chassis portion, according to one or more examples of the present disclosure.

FIG. 14 depicts the device at the sixth stage of assembly 700-6 and is used to illustrate blocks 618 and 620 of the method 600, according to one or more examples of the present disclosure. Namely, at block 618, the cover plate 718 is mounted over an opening of the expansion electronics storage tray 712. This may include securing screws 726 into holes 728 near the side edges 712-SE of the expansion electronics storage tray 712. Mounting (618) the cover plate 718 may also include securing screws into holes near the base edge 712-BE of the expansion electronics storage tray 712 and securing screws through holes in a lip extending from the electronics storage bucket 714.

At block 620, the pair of mounting brackets 720 is coupled to sides of the electronics storage tray 712. This may includes securing screws 726 through holes 728 that couple the mounting brackets 720 near the side edges 712-SE of the expansion electronics storage tray 712.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. An expandable electronics storage chassis, comprising:
   a base electronics storage tray having a first end and a second end, the first end comprising a first base edge and a first pair of side edges that define a first opening;
   an expansion electronics storage tray having a third end and a fourth end, the third end comprising a second base edge and a second pair of side edges that define a second opening, and the fourth end comprising a third base edge and a third pair of side edges that define a third opening,
   wherein, when the expansion electronics storage tray and the base electronics storage tray are attached together, the second end of the expansion electronics storage tray overlaps and is coupled to the first end of the base electronics storage tray.

2. The expandable electronics storage chassis of claim 1, further comprising:
   an opening cover comprising:
      a cover plate mountable over the third opening when the expansion electronics storage tray is attached to the base electronics storage tray and mountable over the first opening when the expansion electronics storage tray is detached from the base electronics storage tray; and
      a pair of mounting brackets coupleable near the third pair of side edges when the expansion electronics storage tray is attached to the base electronics storage tray and coupleable near the first pair of side edges when the expansion electronics storage tray is detached from the base electronics storage tray.

3. The expandable electronics storage chassis of claim 1, further comprising:
   a first electronics storage bucket disposed within the base electronics storage tray; and
   a second electronics storage bucket disposed within the expansion electronics storage tray.

4. The expandable electronics storage chassis of claim 3, wherein:
   the first electronics storage bucket comprises one or more bays to receive a first plurality of electronic components of a first type; and the second electronics storage bucket comprises one or more bays to receive a second plurality of electronic components of the first type.

5. The expandable electronics storage chassis of claim 3, wherein, when the base electronics storage tray and the expansion electronics storage tray are attached together, a first alignment line corresponding to the first base edge of the base electronics storage tray is offset from a second alignment line between a base edge of the first electronics storage bucket and a base edge of the second electronics storage bucket.

6. The expandable electronics storage chassis of claim 1, wherein:
the base electronics storage tray contains one or more bays to receive a first plurality of electronic components; and
the expansion electronics storage tray contains one or more bays to receive a second plurality of electronic components.

7. The expandable electronics storage chassis of claim 1, further comprising a support bracket coupleable to the overlapping first end of the base electronics storage tray and second end of the expansion electronics storage tray to attach the base electronics storage tray to the expansion electronics storage tray.

8. The expandable electronics storage chassis of claim 1, wherein a height of the base electronics storage tray and a height of the expansion electronics storage tray both conform to a standard four rack unit height.

9. A device, comprising:
a base chassis portion, comprising:
a base electronics storage tray defining a first opening at a first end of the base electronics storage tray; and
a first electronics storage bucket disposed within the base electronics storage tray; and
an expansion chassis portion, comprising:
an expansion electronics storage tray defining a second opening at a second end and a third opening at a third end of the expansion electronics storage tray, wherein, when attached to the base electronics storage tray, the second end of the expansion electronics storage tray overlaps and is coupled to the first end of the base electronics storage tray; and
a second electronics storage bucket disposed within the expansion electronics storage tray.

10. The device of claim 9, further comprising:
an opening cover comprising:
a cover plate mountable over the third opening when the expansion electronics storage tray is attached to the base electronics storage tray and mountable over the first opening when the expansion electronics storage tray is detached from the base electronics storage tray; and
a pair of mounting brackets coupleable to the third end when the expansion electronics storage tray is attached to the base electronics storage tray and coupleable to the first end when the expansion electronics storage tray is detached from the base electronics storage tray.

11. The device of claim 9, wherein, when the base electronics storage tray and the expansion electronics storage tray are attached together, a first alignment line corresponding to a base edge of the base electronics storage tray is offset from a second alignment line between a base edge of the first electronics storage bucket and a base edge of the second electronics storage bucket.

12. The device of claim 9, further comprising a support bracket that couples the base electronics storage tray to the expansion electronics storage tray where the first end and the second end overlap.

13. The device of claim 9, wherein a height of the base chassis portion and a height of the expansion chassis portion both conform to a standard four rack unit height.

14. The device of claim 9, wherein a length of the device expands from 1075 millimeters when the expansion electronics storage tray is detached from the base electronics storage tray to 1200 millimeters when the expansion electronics storage tray is attached to the base electronics storage tray.

15. The device of claim 9, wherein:
the first electronics storage bucket comprises one or more bays to receive a first plurality of electronic components; and
the second electronics storage bucket comprises one or more bays to receive a second plurality of electronic components.

16. The device of claim 15, further comprising:
a first plurality of storage disks contained within the one or more bays of the first electronics storage bucket; and
a second plurality of storage disks contained within the one or more bays of the second electronics storage bucket.

17. A method for assembling a device, the method comprising:
overlapping a first end of a base electronics storage tray with a second end of an expansion electronics storage tray;
coupling the first end of the base electronics storage tray to the second end of the expansion electronics storage tray;
mounting a cover plate over an opening defined by a third end of the expansion electronics storage tray; and
coupling a pair of mounting brackets to a pair of sides of the expansion electronics storage tray at the third end of the expansion electronics storage tray.

18. The method of claim 17, further comprising:
removing the cover plate from an opening defined by the first end of the base electronics storage tray before overlapping the first end of the base electronics storage tray with the second end of an expansion electronics storage tray; and
removing the pair of mounting brackets from a pair of sides of the base electronics storage tray at the first end of the base electronics storage tray before overlapping the first end of the base electronics storage tray with the second end of an expansion electronics storage tray.

19. The method of claim 17, further comprising:
inserting a first electronics storage bucket into the base electronics storage tray;
inserting a second electronics storage bucket into the expansion electronics storage tray;
offsetting a first alignment line corresponding to a base edge of the base electronics storage tray from a second alignment line between a base edge of the first electronics storage bucket and a base edge of the second electronics storage bucket.

20. The method of claim 17 further comprising coupling a support bracket to the overlapping first end of the base electronics storage tray and second end of the expansion electronics storage tray.

* * * * *